(12) United States Patent
Jung et al.

(10) Patent No.: US 12,378,661 B2
(45) Date of Patent: Aug. 5, 2025

(54) METHOD OF PREPARING MULTICOMPONENT NANOPATTERN

(71) Applicant: KOREA ADVANCED INSTITUTE OF SCIENCE AND TECHNOLOGY, Daejeon (KR)

(72) Inventors: Hee-Tae Jung, Daejeon (KR); Woo Bin Jung, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 1031 days.

(21) Appl. No.: 16/584,239

(22) Filed: Sep. 26, 2019

(65) Prior Publication Data

US 2020/0102644 A1  Apr. 2, 2020

(30) Foreign Application Priority Data

Oct. 2, 2018  (KR) .................. 10-2018-0117691

(51) Int. Cl.
| | | |
|---|---|---|
| *C23C 14/34* | (2006.01) | |
| *B82Y 30/00* | (2011.01) | |
| *B82Y 40/00* | (2011.01) | |
| *C23C 14/22* | (2006.01) | |
| *G03F 7/00* | (2006.01) | |
| *B82Y 10/00* | (2011.01) | |

(52) U.S. Cl.
CPC ........ *C23C 14/3442* (2013.01); *C23C 14/221* (2013.01); *G03F 7/0002* (2013.01); *B82Y 10/00* (2013.01); *B82Y 30/00* (2013.01); *B82Y 40/00* (2013.01)

(58) Field of Classification Search
CPC .............. C23C 14/3442; C23C 14/221; C23C 14/5833
See application file for complete search history.

(56) References Cited

U.S. PATENT DOCUMENTS

2016/0089723 A1* 3/2016 Jung ..................... B22F 1/054
                                              204/192.34

FOREIGN PATENT DOCUMENTS

| EP | 431558 A | * | 6/1991 | ............. C23C 14/46 |
| KR | 101249981 B1 | | 3/2013 | |
| KR | 101356800 B1 | | 1/2014 | |

OTHER PUBLICATIONS

Chen, P., et al., "Polyelemental Nanoparticle Libraries", "Science: Research Reports", Jun. 24, 2016, pp. 1565-1569, vol. 3552, No. 6293.

(Continued)

*Primary Examiner* — John J Brayton
(74) *Attorney, Agent, or Firm* — HULTQUIST, PLLC; Steven J. Hultquist

(57) ABSTRACT

Disclosed is a method of producing a multicomponent nanopattern having a regular array and allowing a variety of combinations of compositions by depositing a film including a multicomponent material on a substrate having a prepattern formed thereon and then conducting ion-etching thereon twice. The method can be utilized in a variety of applications requiring considerably regularly arranged multicomponent nanostructures such as transistors, organic optoelectronic devices, catalysts and gas sensors.

11 Claims, 10 Drawing Sheets

(56) References Cited

OTHER PUBLICATIONS

Jeon, H., et al., "New Top-Down Approach for Fabricating High-Aspect-Ratio Complex Nanostructures with 10 nm Scale Features", "Nano Lett.", 2010, pp. 3604-3610, vol. 10.

Jung, W., et al., "Three-Dimensional Multi-Component Nanopatterns for High Performance Gas Sensor", "16th International Nanotech Symposium and Nano-Convergence Exhibition: Nano Korea 2018", Jul. 2018, pp. 1.

* cited by examiner

METHOD OF PREPARING MULTICOMPONENT NANOPATTERN

CROSS-REFERENCE TO RELATED APPLICATION

The priority under 35 USC § 119 of Korean Patent Application 10-2018-0117691 filed Oct. 2, 2018 is hereby claimed. The disclosure of Korean Patent Application 10-2018-0117691 is hereby incorporated herein by reference in its entirety, for all purposes.

TECHNICAL FIELD

The present invention relates to a method of preparing a multicomponent nanopattern. More particularly, the present invention relates to a method of preparing a multicomponent nanopattern including depositing a film including a multicomponent material on a substrate having a prepattern formed thereon and then conducting ion-etching thereon twice to form the multicomponent nanopattern.

BACKGROUND ART

Conventionally, top-down and bottom-up processes were used to produce nanoparticle-scale multicomponent materials. Bottom-up methods have been mainly used to produce multicomponent particles having a uniform nano-size and a typical method is to produce nanoparticles while simultaneously reducing multicomponent metal precursor materials. This method provides formation of various combinations or shapes of metals. A representative top-down method is deposition. In particular, this method has no limit as to the combination of components. In recent years, methods of implementing a multicomponent system with a nanopattern having a predetermined array (alignment) have been studied. Dip-pen lithography is a method for forming a polymetallic nanopattern by dipping an end of a nanometer-scale tip into a polymer ink containing a metal precursor and conducting reduction.

In order to produce nanometer-scale multicomponent particles, a method of simultaneously reducing polymetallic precursors has been used as a bottom-up method and studies have been conducted to control various shapes and compositions. However, conventional methods have disadvantages in that various combinations of metals are not free and it is difficult to produce multicomponent particles with the same shape at the same composition ratio because the conditions for reducing respective metals are different. In addition, a bottom-up method has a difficulty of forming a uniform alignment on a specific substrate and thus being inapplicable to meta-materials, electronic devices, optical electronic devices and the like, which are predominantly based on multicomponent materials. Meanwhile, the top-down method can be implemented by a variety of methods such as photolithography and soft-lithography, and a desired shape of array can be obtained depending on used pattern. However, the top-down method has a difficulty in uniform mixing, since a polymetallic material is formed by deposition. In order to overcome the disadvantages of the bottom-up and top-down methods, a combination thereof has been used recently. Dip-pen lithography is a method of creating a pattern by dipping a tip into an ink containing a metal precursor, which can produce a polymetallic pattern including spherical particles having a uniform array after reduction. In addition, there is another method of producing a polymetallic nanopattern by introducing a metal precursor into a block copolymer pattern, reducing the block copolymer, and then removing the block copolymer. Both of these methods can provide formation of multicomponent systems with various metals, but have a disadvantage of not being homogeneously mixed depending on material.

Korean Patent No. 10-1249981 discloses a method of producing a three-dimensional nanostructure by applying an ion bombardment phenomenon to a peripheral surface of a patterned polymer structure through a physical ion etching process. Hwan-Jin Jeon et al. discloses a patterning technique capable of producing various three-dimensional patterns having a high resolution and a high aspect ratio by a top-down method (Hwan-Jin Jeon et al. "New Top-Down Approach for Fabricating High-Aspect-Ratio Complex Nanostructures with 10 nm Scale Features", Nanoletters, 10, 3604-3610 (2010)). Also, Korean Patent No. 10-1356800 discloses a three-dimensional multicomponent nanostructure and a method of producing the same. This does not disclose a multicomponent-based nanostructure and discloses different nanopatterns which include different components and are mounted on one substrate, that is, fails to implement a nanopattern based on a multicomponent material. In addition, Pen-Cheng Chen et al. discloses a method of forming multicomponent nanoparticles, but this method has a limitation of applicability only to spherical nanoparticles and a problem of impossibility of implementing a continuous pattern for use in electronic devices (Peng-Cheng Chen et al. "Polyelemental nanoparticle libraries", Science, 352 (6293), 1565-1569 (2016)).

Therefore, there is urgent demand for methods that are capable of producing multicomponent nanopatterns having a high resolution and a high aspect ratio while homogeneously mixing even a combination of materials having various compositions.

In order to solve the above problems, the present inventors have made intensive efforts to prepare multicomponent nanopatterns by homogeneously mixing metals with metal oxides, sulfides, polymers and the like. As a result, the present inventors have found that a multicomponent nanopattern can be formed by depositing a film of a multicomponent material of two or more selected from the group consisting of organic materials and inorganic materials on a substrate having a prepattern formed thereon, and re-depositing the multicomponent material on the side surface of the prepattern through an ion etching process to form a nanometer-scale multicomponent nanopattern. Based on this finding, the present invention has been completed.

DISCLOSURE OF INVENTION

Therefore, in an attempt to solve the problems of the prior art, associated with the difficulty to produce a multicomponent nanostructure having a regular (uniform) array, it is an object of the present invention to provide a method of producing a multicomponent nanopattern allowing various combinations of two or more components and an array thereof and having a high resolution and a high aspect ratio.

In accordance with the present invention, the above and other objects can be accomplished by the provision of a method of producing a multicomponent nanopattern including (a) depositing a film of a multicomponent material of two or more selected from the group consisting of organic materials and inorganic materials on a substrate having a prepattern formed thereon, and (b) re-depositing the multicomponent material on the side surface of the prepattern through an ion etching process to form a multicomponent nanopattern.

In accordance with another aspect of the present invention, the present invention provides a multicomponent nanopattern produced by the method and including a multicomponent material of two or more selected from the group consisting of metals, metal oxides, metal sulfides and polymers.

In accordance with yet another aspect of the present invention, the present invention provides a catalyst including the multicomponent nanopattern.

BEST MODE FOR CARRYING OUT THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
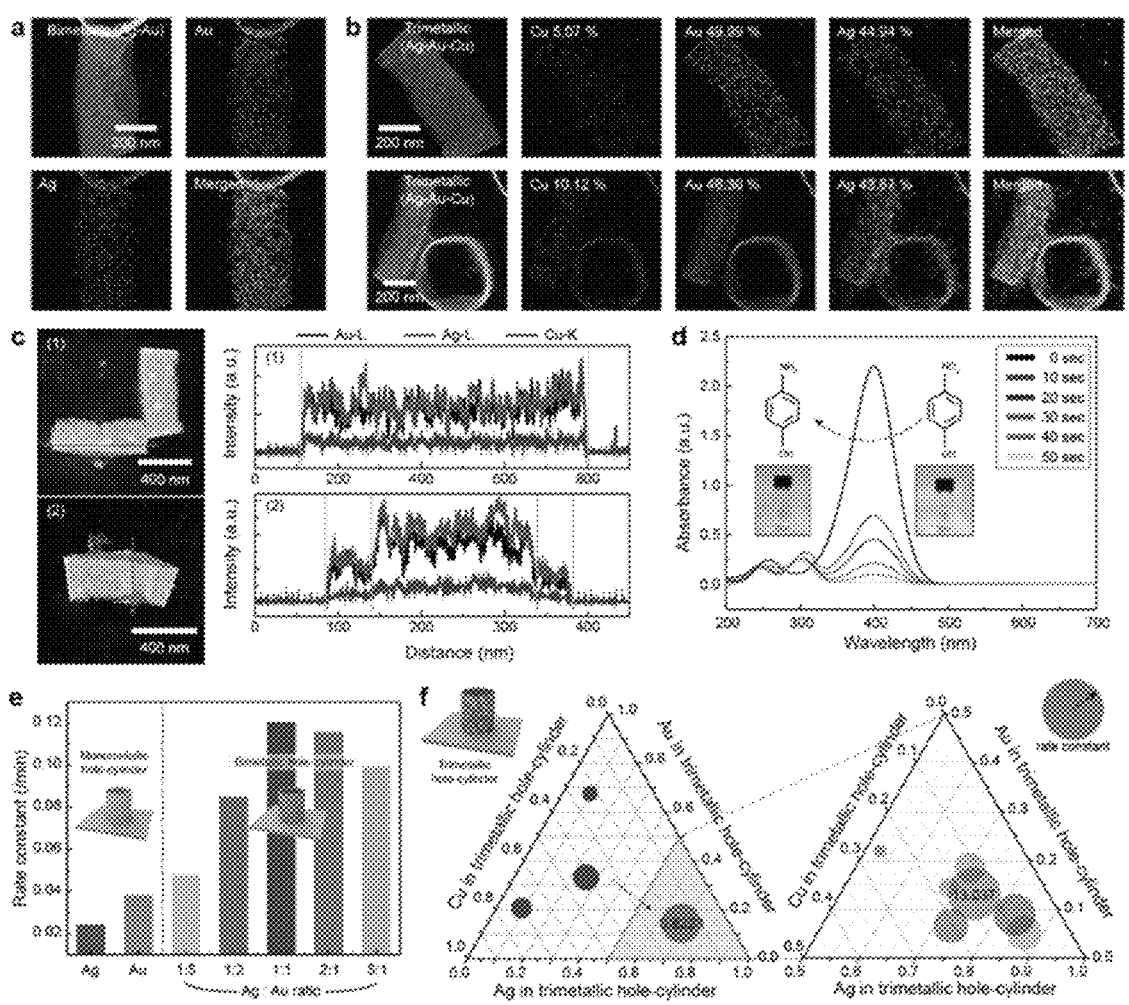
Figure 5:
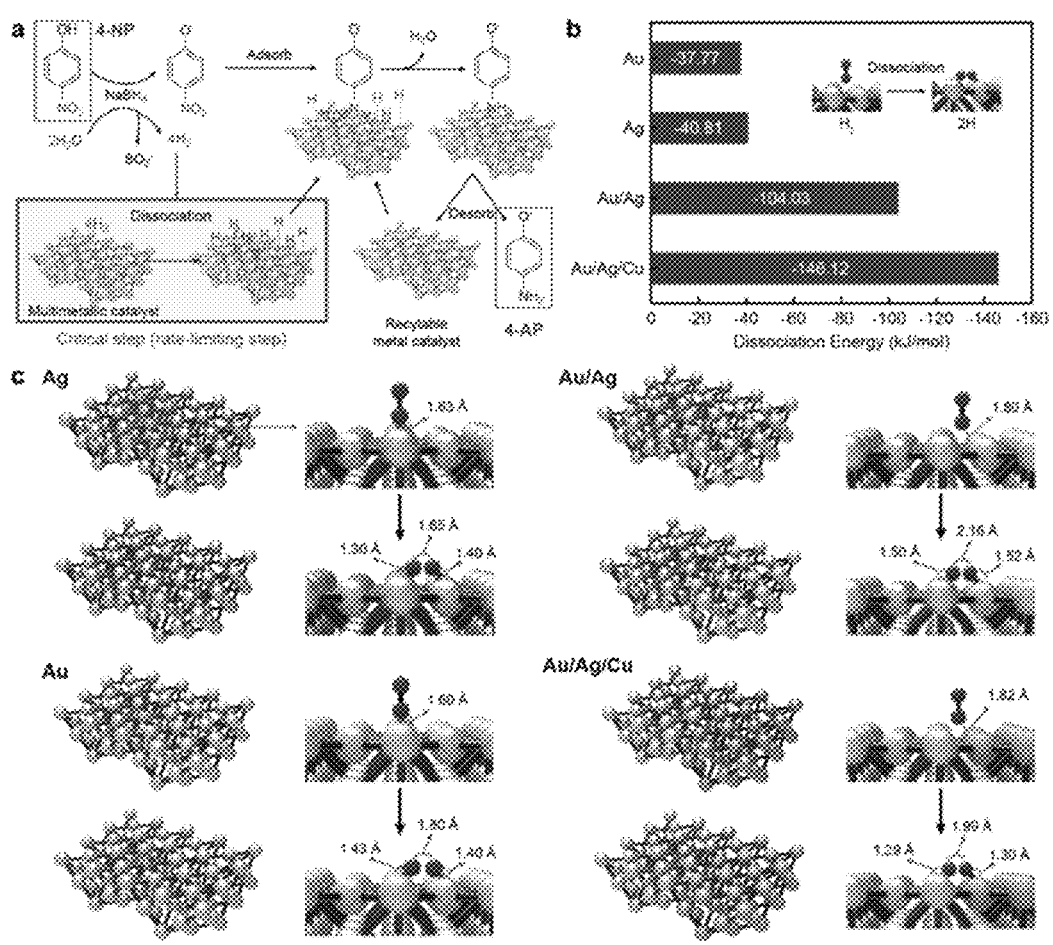
Figure 6:
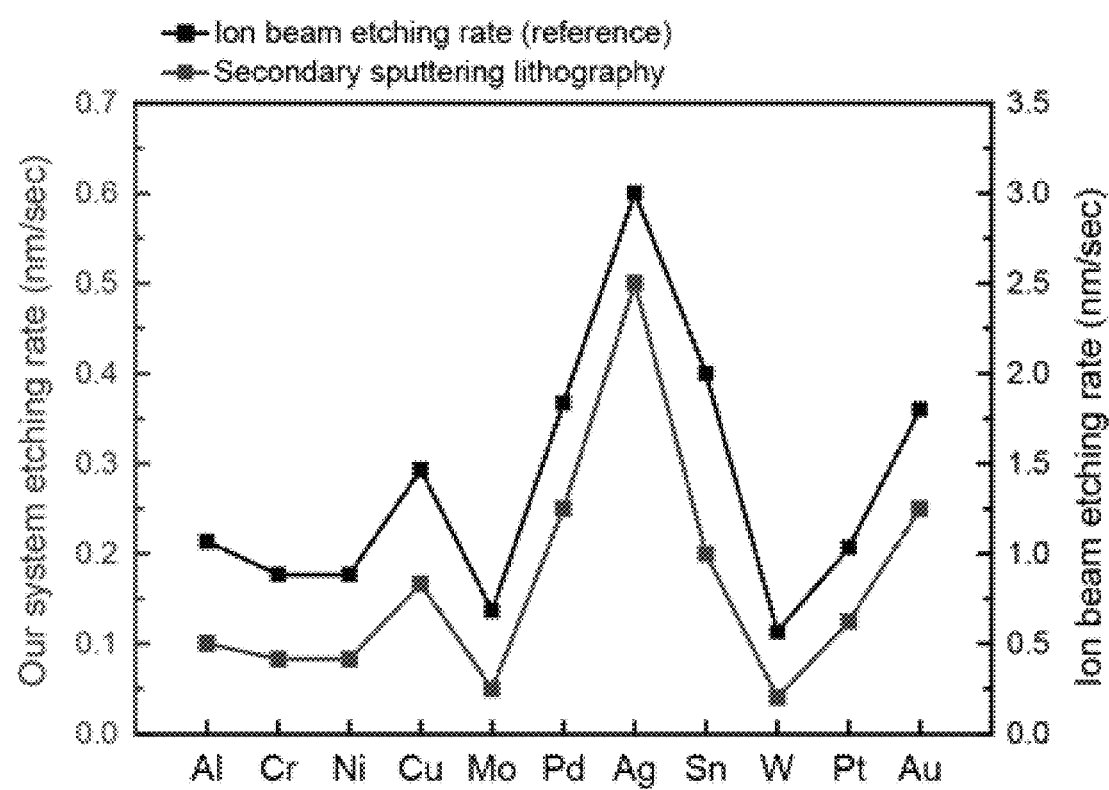
Figure 7:
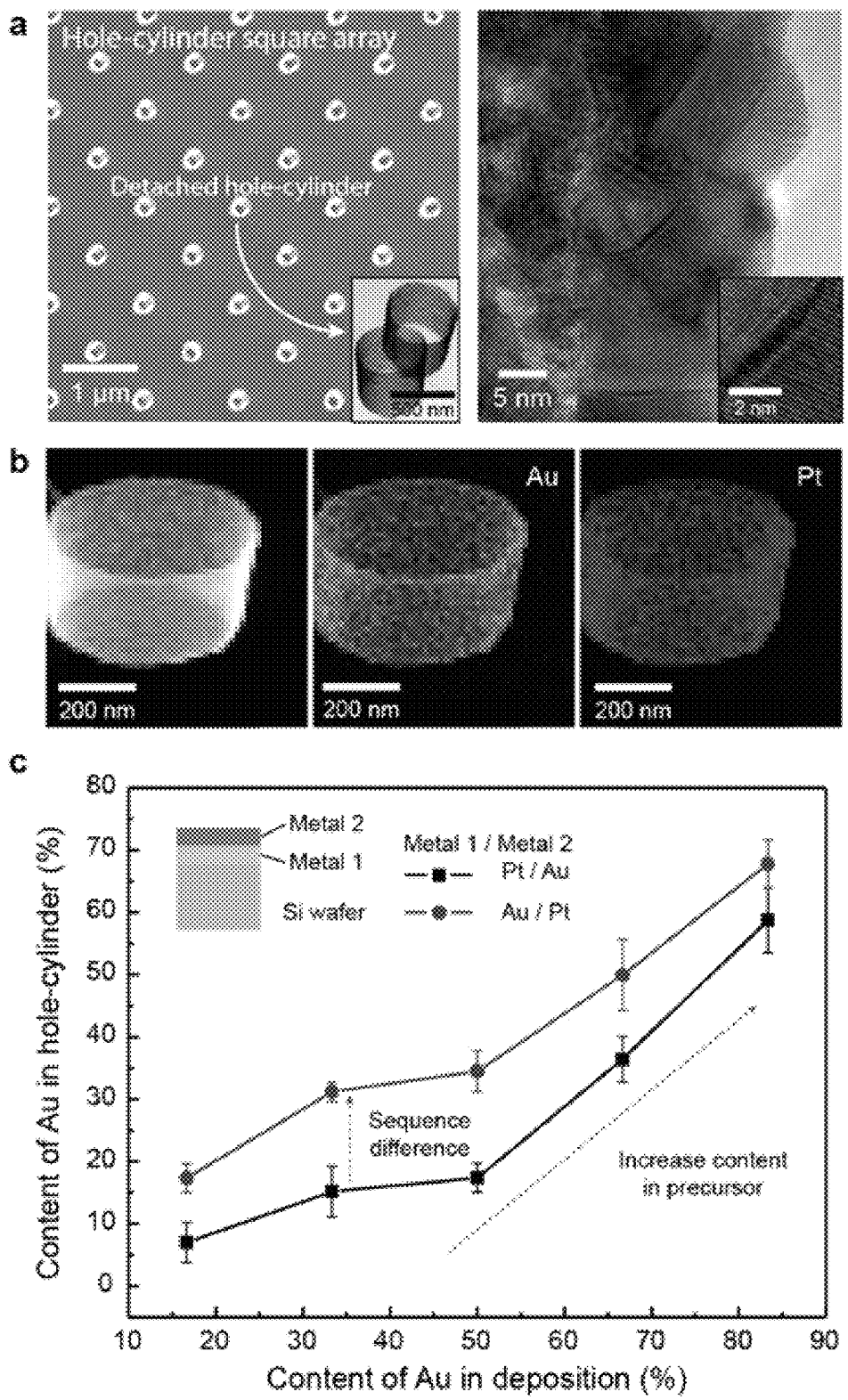
Figure 8:
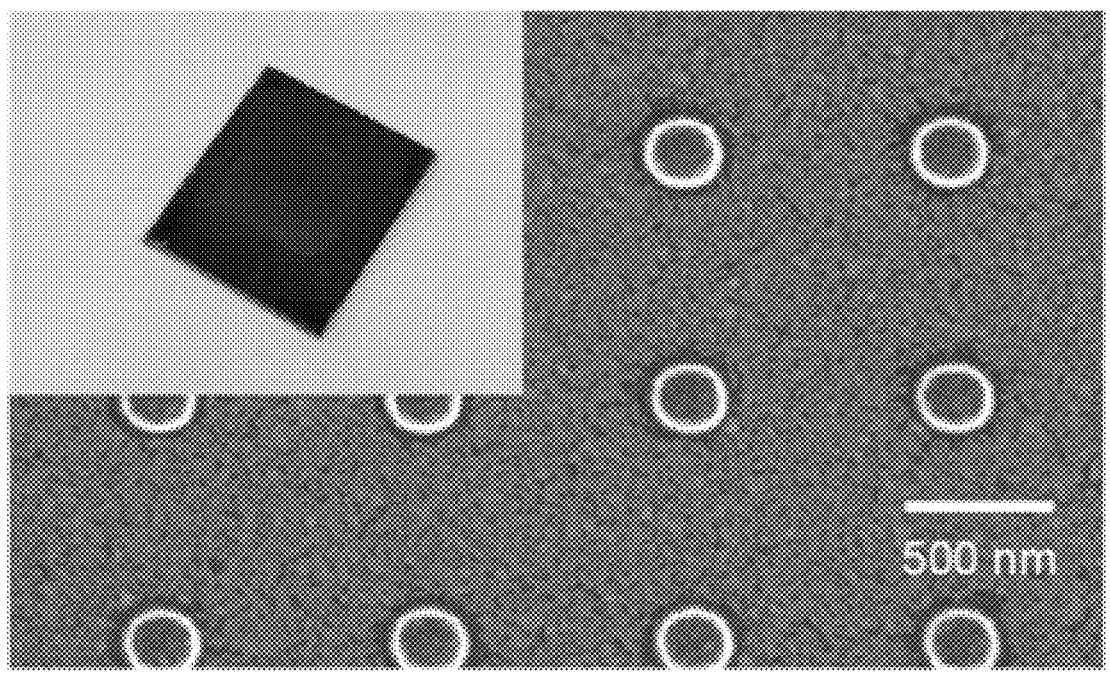
Figure 8:
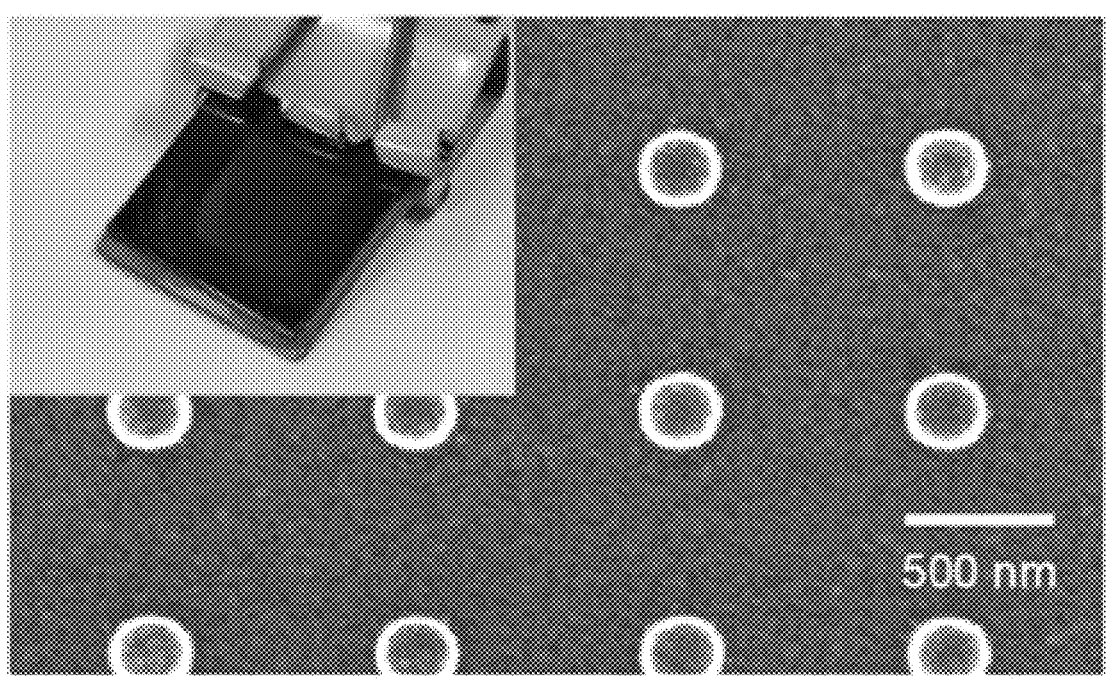
Figure 9:
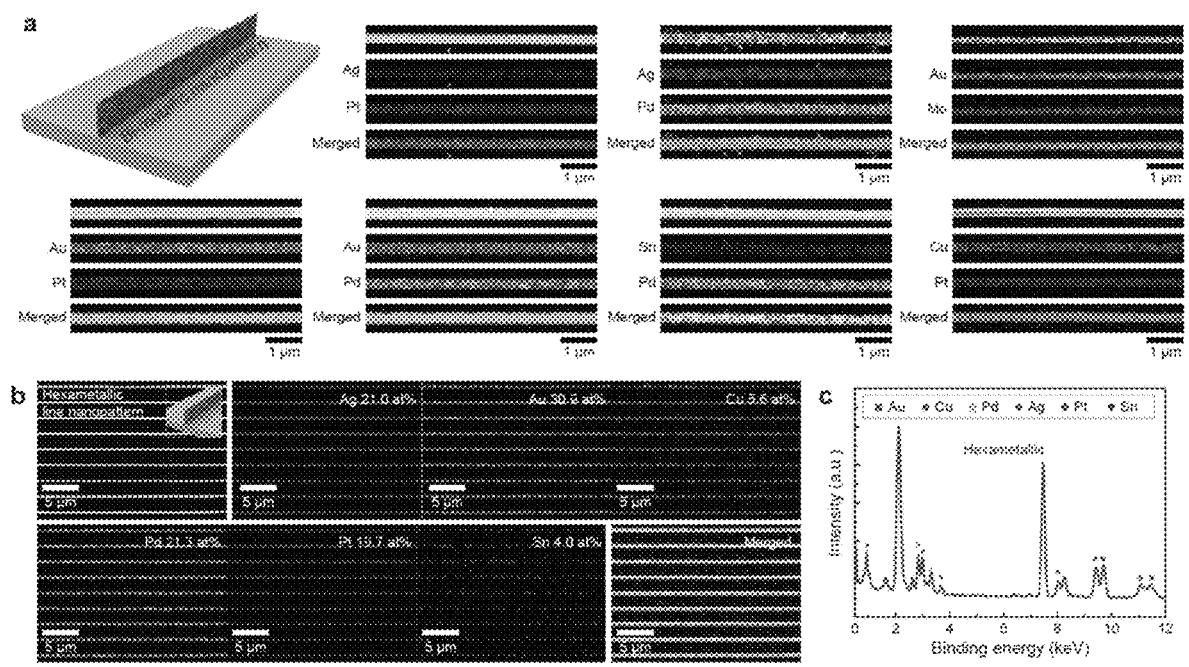
Figure 10:
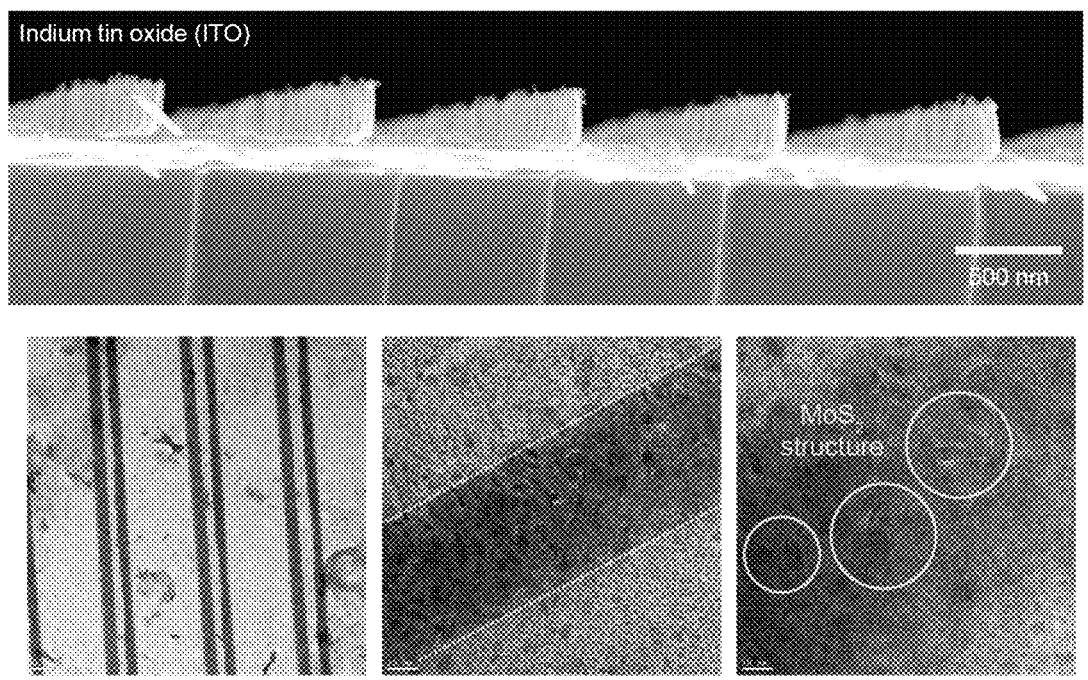

FIG. 4 shows the results of analysis of catalytic properties through the controlled composition of a) a cylindrical two-component nanoparticle structure of gold and silver and b) a three-component nanoparticle structure of gold, silver and copper, as catalysts for reduction reaction of nitrophenol according to one embodiment of the present invention, c) a TEM image and an EDS profile of three-component nanoparticles, d) a UV-Vis spectroscope image showing reduction of nitrophenol particles into aminophenol particles, and graphs showing comparison in reaction rate constant between e) a two-component system and f) a three-component system;

FIG. 5 shows a) calculation of DFT corresponding to the energy state of a reaction which determines a reaction rate in a mechanism of reduction of nitrophenol according to one embodiment of the present invention, b) the energy state in each combination and c) the position of hydrogen particles in each combination;

FIG. 6 is a graph showing an etching rate of each metal during argon etching according to one embodiment of the present invention;

FIG. 7 is TEM and SEM images of cylindrical nanostructures formed with gold and platinum according to one embodiment of the present invention, and shows the results when the composition is controlled;

FIG. 8 is SEM images showing cylindrical nanostructures formed on a silicon substrate before and after nitrophenol reduction catalyst testing according to one embodiment of the present invention;

FIG. 9 shows the results of component analysis of multi-component (six-component) nanopatterns based on the secondary sputtering phenomenon according to one embodiment of the present invention; and FIG. 10 shows the results of component analysis of multi-component nanopatterns formed with metal oxide or metal sulfide based on the secondary sputtering phenomenon according to one embodiment of the present invention.

Unless defined otherwise, all technical and scientific terms used herein have the same meanings as appreciated by those skilled in the field to which the present invention pertains. In general, the nomenclature used herein is well-known in the art and is ordinarily used.

The present invention is based on the finding that, when a nanometer-scale multicomponent nanopattern is formed by depositing a film of a multicomponent material of two or more selected from the group consisting of organic materials and inorganic materials on a substrate having a prepattern formed thereon, and re-depositing the multicomponent material on the side surface of the prepattern through an ion etching process, in order to produce a multicomponent nanopattern including a homogeneous mixture of a metal with a metal oxide, a metal sulfide, a polymer or the like, the multicomponent nanopattern, multiple of which components are homogeneously mixed, has a high resolution and a high aspect ratio, and can form uniform and various arrays in a considerably wide area.

Therefore, in one aspect, the present invention is directed to a method of producing a multicomponent nanopattern including (a) depositing a film of a multicomponent material of two or more selected from the group consisting of organic materials and inorganic materials on a substrate having a prepattern formed thereon, and (b) re-depositing the multicomponent material on the side surface of the prepattern through an ion etching process to form a multicomponent nanopattern.

In another aspect, the present invention is directed to a method of preparing a multicomponent nanopattern comprising: (a) depositing a film of a multicomponent material of two or more selected from the group consisting of organic materials and inorganic materials on a substrate and forming a prepattern thereon; and (b) forming a multicomponent nanopattern by re-depositing the multicomponent material on a side surface of the prepattern through an ion etching process.

In another aspect, the present invention is directed to a multicomponent nanopattern produced by the method and including a multicomponent material of two or more selected from the group consisting of metals, metal oxides, metal sulfides and polymers.

Hereinafter, the present invention will be described in more detail.

In the present invention, a multicomponent nano-pattern can be produced using a secondary sputtering phenomenon. The multicomponent nanopattern is produced by adhering emitted (bounced) particles to the wall of the prepared prepattern by surface etching using argon plasma. As a result, the multicomponent system prepared on the surface is mixed during the etching process and adhered to the wall surface, to produce a multicomponent nanopattern having a thickness of several tens of nanometers. This method allows combinations of various materials such as metals, metal oxides, transition metal sulfides and polymers. In addition, the nanopattern can have a variety of shapes since the shape of the pattern determines the array (alignment) and shape of the nanopattern. In addition, the composition and internal structure of the resulting nanopattern can be controlled by adjusting the amount or order of the materials prepared on the surface. Although a conventional method failed to impart various arrays to multicomponent nanopatterns, the patterning method of the present invention has an advantage of forming regular and various arrays over a very wide area.

In the present invention, the multicomponent nanopattern may exhibit catalytic properties, unlike conventional single component nanopatterns. The multicomponent nanopattern can maintain substantially the same levels of uniformity, resolution and aspect ratio as conventional single component nanopatterns and control the internal structure to a layer structure, mixed structure, core-shell structure or the like. In addition, the multicomponent nanopattern has considerably improved catalytic properties compared to the conventional single-component nanopattern.

In the present invention, the prepattern of step (a) may be formed by coating a substrate with a prepattern material and performing a lithography or imprinting process thereon. The prepattern may be formed using an inexpensive imprinting process or a photolithography process and thus expensive equipment is unnecessary.

In the present invention, the film of the multicomponent material of step (a) may be a monolayer film including a multicomponent material or a multilayer film including a multicomponent material.

In the present invention, the method may further include (c) removing a residual layer of the film of the multicomponent material through an ion etching process, after step (b).

In addition, the ion etching process of step (b) may be performed by milling or sputtering. The ion etching process may be performed by forming a plasma using a gas at a pressure of 0.001 mTorr to 700 Torr, and accelerating the plasma to 100 to 2,000 V. The gas may be selected from the group consisting of argon, helium, nitrogen, oxygen, and mixtures thereof, but is not limited thereto.

In the present invention, the organic material may be a polymer, and the inorganic material may be a metal, a metal oxide, or a metal sulfide. The metal may include at least two selected from the group consisting of Au, Ag, Cu, Al, Ni, Pt, Pd, Sn, Mo, Ti, Cr, Mn, Fe, Co, Zn, In, W, Ir and Si, and any metal can be used without limitation as long as it can be released in various directions when applying energy thereto to use an ion bombardment phenomenon through physical ion etching.

A combination of multicomponent metals is preferably a two-component material selected from the group consisting of Au—Cu, Au—Pt, Au—Ni, Au—Ag, Au—Pd, Pd—Ag, Ni—Sn, Mo—Ni, Au—Al, Au—Sn, Au—Mo, Au—Ti, Au—Cr, Au—Mn, Au—Fe, Au—Co, Au—Zn, Au—In, Au—W, Au—Ir, Au—Si, Ag—Cu, Ag—Al, Ag—Ni, Ag—Pt, Ag—Pd, Ag—Sn, Ag—Mo, Ag—Ti, Ag—Cr, Ag—Mn, Ag—Fe, Ag—Zn, Ag—In, Ag—W, Ag—Ir and Ag—Si, or a three-component material selected from the group consisting of Au—Ag—Cu, Au—Cu—Pt, Au—Ag—Pt, Au—Ag—Pd, Au—Cu—Pd, Ag—Cu—Pt and Ag—Cu—Pd. However, the multicomponent material is not limited thereto and may be a combination of two to six types of components.

In the present invention, the multicomponent material may be a combination of 2 to 6 types of components, but the present invention is not limited thereto.

In the present invention, any substrate may be used as the substrate without limitation as long as it can be prepatterned and the substrate is preferably selected from the group consisting of polymer transparent substrates such as polyethylene terephthalate (PET), polyarylate (PAR) and polyethylene (PE), quartz, glass, silicon, silicon oxide, and mixtures thereof, and is preferably a transparent glass substrate.

The ion etching process is performed under vacuum of about $10^{-6}$ Torr and the time is controlled in consideration of a film thickness of the multicomponent material to be deposited. The degree of vacuum and the time can be controlled in inverse proportion to each other and can be controlled in consideration of the intensity of the ion beam. When the strength is too strong, the re-deposition of the side of the desired prepattern is not performed in the present invention, and only a general milling effect is obtained. Any material can be used as the material used for the prepattern as long as it is capable of forming a structure by a method such as lithography or imprinting. Preferably, the prepattern may be polystyrene, chitosan, polyvinyl alcohol, polymethylmethacrylate (PMMA), polyvinyl pyrrolidone, photoresist (PR), or a mixture thereof.

In the present invention, the film thickness of the monolayer structure or the multilayer structure may be 0.1 nm to 500 nm, and the thickness of the film of each layer in the multilayer structure may be 0.1 nm to 500 nm.

Figure 3:
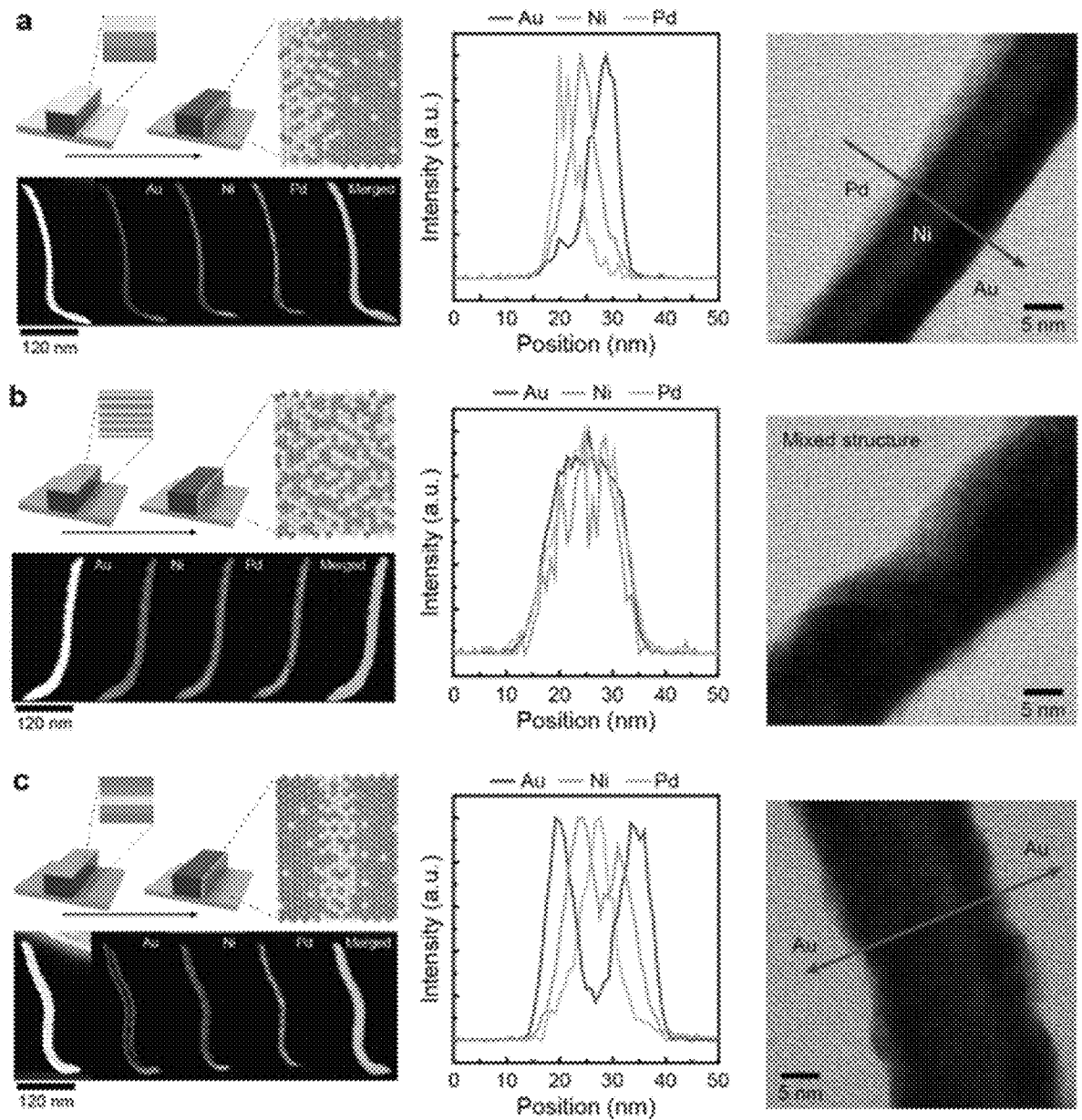
FIG. 3 is EDS and TEM images showing that the resulting pattern is obtained as a) a layered structure, b) a homogeneously mixed structure, or c) a core-shell or sandwich structure depending on a composition of three metals provided on the surface.

In addition, when the multicomponent material is mixed using the secondary sputtering phenomenon, the internal structure of the resulting nanopattern can be controlled according to a film composition before etching. When the layers are stacked on top of each other with a film thickness of 10 nm or more, the internal structure of the resulting pattern also has a layered structure. When the layer is prepared with a thickness of 5 nm or less, the internal structure of the nanopattern is homogeneously mixed. In addition, when the order of the films is controlled so as to form a sandwich structure, the internal structure of the nanopattern also has a sandwich structure (FIG. 3).

The multicomponent nanopattern of the present invention can be utilized in various applications requiring considerably regularly arranged multicomponent nanostructures and in particular, can be used to produce catalysts, field effect transistors, photovoltaic devices, organic optoelectronic devices and gas sensors.

Accordingly, in another aspect, the present invention is directed to a catalyst including the multicomponent nanopattern.

As shown in FIGS. 4 and 5, when the characteristics of the catalyst of a reduction reaction of nitrophenol were examined according to one embodiment of the present invention, the multicomponent system shows a faster reaction rate than a single metal and has excellent catalytic performance for nitrophenol reduction. In addition, it can be seen that the pattern is well maintained and thus the performance of the catalyst is stably maintained even after the catalyst test (FIG. 8).

Hereinafter, the present invention will be described in more detail with reference to the following examples. However, it will be obvious to those skilled in the art that the following examples are provided only for illustration of the present invention and should not be construed as limiting the scope of the present invention.

EXAMPLE

Example 1

Production of Multicomponent Nanostructure

Example 1-1

Production of Two-Component Nanostructure

Figure 1:
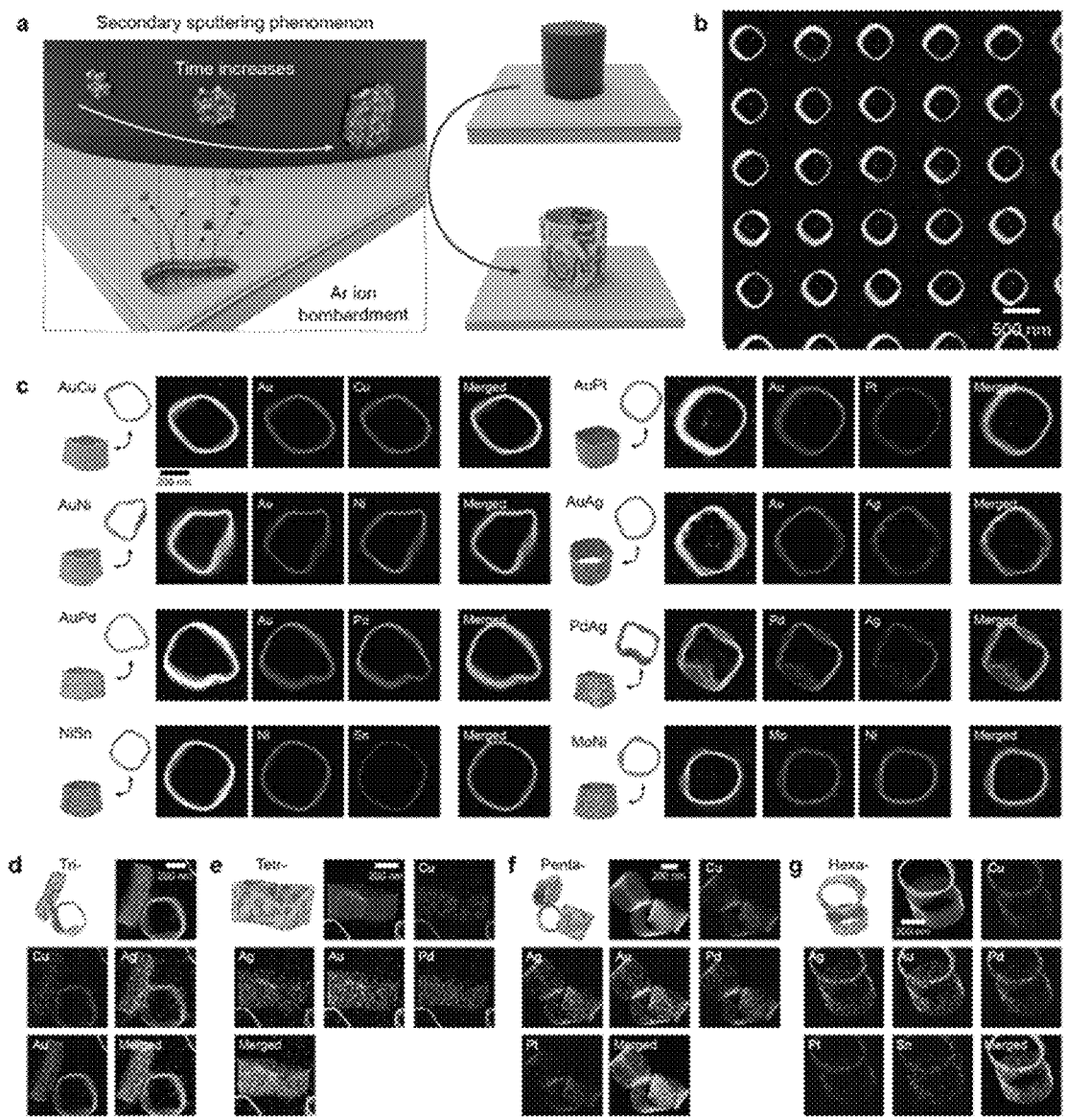
FIG. 1 is a schematic diagram illustrating a) a method of producing multicomponent nanoparticles based on a secondary sputtering phenomenon according to one embodiment of the present invention and the resulting multicomponent nanoparticles, b) TEM, c) two-component TEM-EDS images of various combinations, and d)-g) multicomponent TEM-EDS images.

As shown in FIG. 1, a two-component metal such as Au—Cu, Au—Pt, Au—Ni, Au—Ag, Au—Pd, Pd—Ag, Ni—Sn or Mo—Ni as a material for a pattern to be formed was deposited on a PET transparent substrate coated with polystyrene. The multicomponent material was redeposited on the pattern wall by etching with Ar ions at a pressure of 0.001 mTorr using an ion milling process (beam power: 500 eV, 0.03A Ar+ ion bombardment energy). The remaining layer of the film was removed through an ion milling process to produce a multicomponent nanostructure.

As shown in FIG. 1A, a multicomponent system was formed using a secondary sputtering phenomenon and particles etched by argon plasma were repelled (bounced off) and then stuck to the wall surface of the prepattern prepared in advance. The resulting pattern was formed with a very small thickness of 50 nm or less in a regular array (arrangement).

Figure 2:
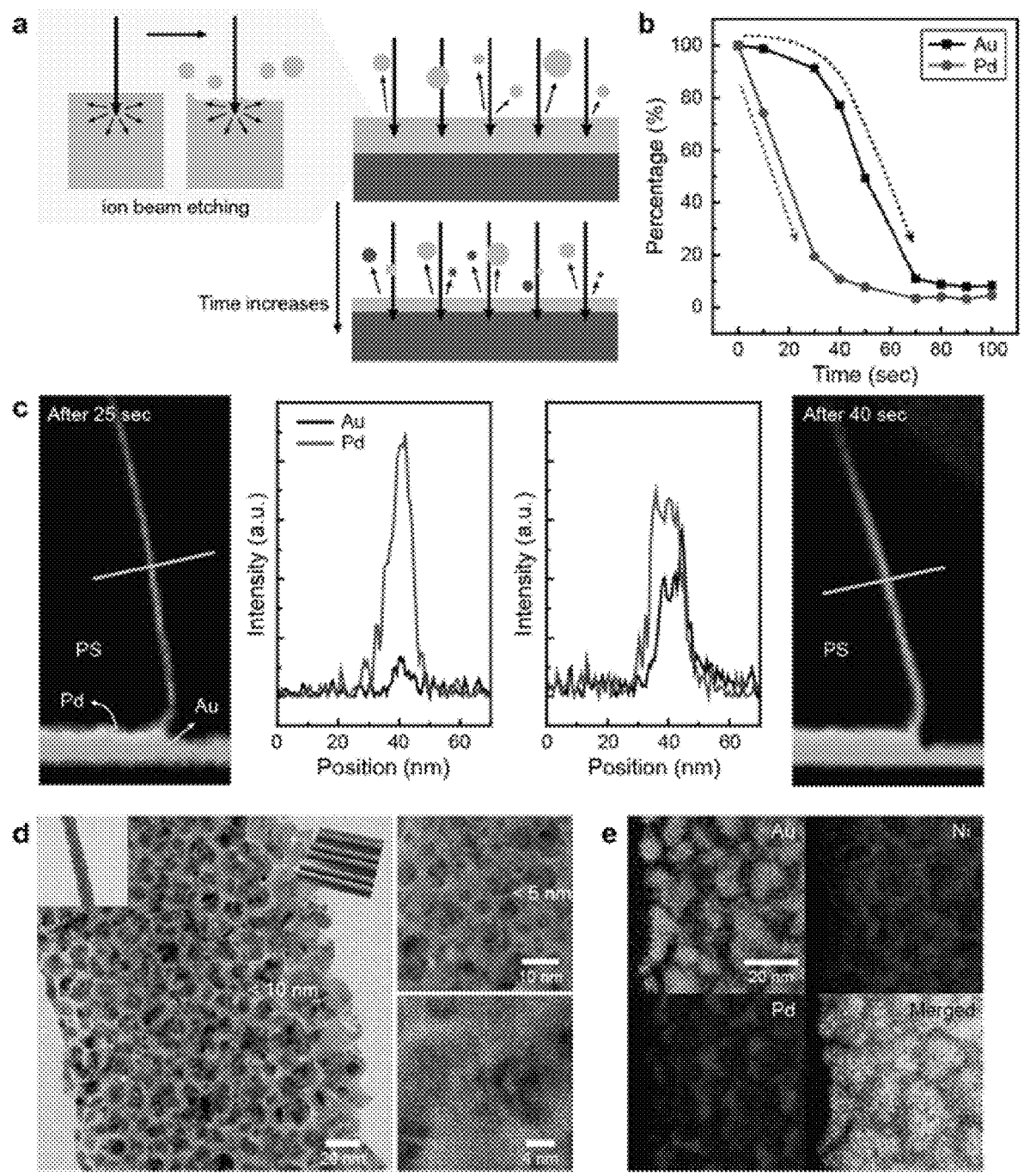
FIG. 2 is a schematic diagram illustrating a principle of producing a) a multicomponent system by a secondary sputtering phenomenon, b) an etching profile, c) cross-sectional TEM-EDS of two-component linear patterns, and d) a TEM image and e) TEM-EDS images of a pattern formed with three metals.

In the present invention, in order to show that there is no limitation as to a combination of metals, a variety of two-component (binary) metal combinations are produced and homogeneous mixing between the metals is demonstrated. In addition, it is found that metals are homogeneously mixed even in multicomponent systems of two or more (FIG. 1). In order to demonstrate how the secondary sputtering phenomenon occurs, the amounts of metals remaining on the surface material layer and the composition of the cross-section thereof were measured and observed under the hypothesis that the argon ions permeate the surface material layer and the upper part thereof is repelled. As a result, etching was conducted by permeation, and TEM and EDS analysis showed that small particles having a size of less than 5 nm were mixed (FIG. 2).

It was found that the internal structure of the resulting nanopattern can be controlled according to the composition of the film before etching when the multicomponent material is mixed using the secondary sputtering phenomenon. It can be seen that, when the layers are stacked on top of each other with a film thickness of 10 nm or more, the resulting internal structure of the pattern also has a layered structure (FIG. 3A). It can be seen that, when the layer is prepared as a film of 5 nm or less, the pattern has a homogeneously mixed internal structure (FIG. 3B). In addition, it can be seen that, when the film is sequentially formed as a sandwich structure, the internal structure of the nanopattern also had a sandwich structure (FIG. 3C).

Example 1-2

Production of Six-Component Nanostructure

As shown in FIG. 9, a multicomponent nanostructure was produced in the same manner as in Example 1-1, except that Au—Cu—Pd—Ag—Pt—Sn was deposited as a six-component metal, which was a material for a pattern to be formed on a PET transparent substrate coated with polystyrene.

As can be seen from FIG. 9A, a two-component nanostructure can be formed using various metal combinations and there is no limitation as to the kind thereof. As can be seen from FIG. 9B, a mixture of six types of metals can be incorporated in one structure and the result of component analysis shows that all kinds of metals, which are intended to be mixed, are detected, as shown in FIG. 9C.

Example 1-3

Production of Nanostructure Containing Metal Oxide or Metal Sulfide

As shown in FIG. 10, the production with metal oxide or metal sulfide is also possible. In the case of the metal oxide shown in FIG. 10, indium tin oxide (ITO) was first deposited on a substrate and then adhered to the wall surface of a prepattern using secondary sputtering. In the case of metal sulfide, molybdenum disulfide, tungsten disulfide, tin disulfide or the like can be used, and the metal sulfide shown in FIG. 10 is derived from molybdenum disulfide. As can be seen from the result of TEM, when the line-shaped pattern is enlarged (observed at magnification), the interlayer spacing of $MoS_2$ can be seen. In order to produce a nanostructure with metal disulfide, a pattern including only a metal, not a sulfide, was first formed and sulfur treatment was then conducted. The sulfur treatment was carried out by injecting sulfur and a pattern sample into a vacuum tube and adjusting the temperature to 600 to 1,000° C.

Example 2

Use of Multicomponent Nanostructures as Catalysts

Catalyst tests were conducted to identify the effect of multicomponent nanostructures. The catalyst tests were conducted using a two-component (binary) cylindrical nanoparticle structure including gold and silver (FIG. 4A) and a three-component (ternary) nanoparticle structure of gold, silver and copper (FIG. 4B) as catalysts for the reaction of reducing nitrophenol. A combination of the two-component system and the three-component system was compared with a single metal in terms of performance. It can be seen from TEM images and EDS profiles shown in FIG. 4C that the three-component (ternary) nanoparticles were homogeneously mixed. The reduction process of nitrophenol was observed using UV-Vis spectroscopy. The result showed that the reaction rate of the two-component (binary) nanostructure was improved than that of a single metal (FIG. 4E), and that the reaction rate of the three-component (ternary) nanostructure was 300 times higher than that of the single metal (FIG. 4F). In order to find why the nitrophenol reaction is accelerated, the energy change was calculated for the rate determination step of the nitrophenol reaction through DFT simulation. The result showed that the two-component (binary) nanostructure exhibited a greater energy change than the single metal, and the three-component (ternary) nanostructure exhibited the greatest energy change and thus the greatest reaction rate, which indicates that multicomponent nanoparticles are effective in reducing nitrophenol (FIG. 5). In the present invention, the etching rate of metal was measured and the rate of secondary sputtering was compared with the rate of conventional ion milling because secondary sputtering was induced through weak etching compared to a conventional ion milling method (FIG. 6). In addition, the composition of the cylindrical nanostructure was controlled with gold and platinum in order to find that the control of the composition of the film enabled the composition of the resulting nanostructure to be controlled (FIG. 7). SEM images before and after the reaction of the cylindrical patterns showed that the patterns were well maintained even after the catalyst test (FIG. 8).

INDUSTRIAL APPLICABILITY

The method of producing a multicomponent nanopattern according to the present invention provides formation of a multicomponent nanopattern which allows various combinations of two or more components and an array thereof, and has a high resolution and a high aspect ratio.

The method can be utilized in various applications requiring considerably regularly arranged multicomponent nanostructures and in particular, can be used to produce field effect transistors, photovoltaic devices, organic optoelectronic devices, gas sensors, catalysts and the like. In addition, in accordance with the present invention, nanostructure patterns including considerably small particles with a size of 5 nm or less can be produced and research associated with a conventional domain size is considered to be possible as well.

Although the specific configurations of the present invention have been described in detail, those skilled in the art will appreciate that this description is provided as preferred embodiments and should not be construed as limiting the scope of the present invention. Therefore, the substantial scope of the present invention is defined by the accompanying filed claims and equivalents thereto.

What is claimed is:

1. A method of preparing a multicomponent nanopattern of mixture of multicomponent material comprising sequential steps (a) and (b):
   (a) depositing a film including homogeneous mixture of a multicomponent material selected from the group consisting of two or more polymers; two or more metals; two or more metal oxides; and two or more metal sulfides, on a substrate having a prepattern formed thereon; and
   (b) forming the multicomponent nanopattern of mixture of multicomponent material by re-depositing the mixture of the multicomponent material from the film deposited in step (a) on a side surface of the prepattern through an ion etching process,
   wherein steps (a) and (b) are carried out to form a multilayer structure of layers of the homogeneous mixture of the multicomponent material on the substrate prepattern and side surface of the prepattern,
   wherein the film deposited in step (a) for each layer has a film thickness of 5 nm or less,
   wherein the metal is selected from the group consisting of Au, Ag, Cu, Al, Ni, Pt, Pd, Sn, Mo, Ti, Cr, Mn, Fe, Co, Zn, In, W, Ir and Si, and
   wherein multicomponent material is mixed using secondary sputtering phenomenon and internal composition and structure of resulting nanopattern is controlled according to a film composition before the ion etching process.

2. The method of claim 1, wherein the prepattern of step (a) is formed by coating a prepattern material on the substrate and conducting lithography or imprinting thereon.

3. The method of claim 1, further comprising (c) removing a residual layer of the film of the multicomponent material through an ion etching process, after step (b).

4. The method of claim 1, wherein the ion etching process of step (b) is conducted by milling or sputtering.

5. The method of claim 1, wherein the ion etching process is conducted by forming a plasma using a gas at a pressure of 0.001 mTorr to 700 Torr, and accelerating the plasma to 100 to 2,000 V.

6. The method according to claim 1, wherein the metal is a two-component material selected from the group consisting of Au—Cu, Au—Pt, Au—Ni, Au—Ag, Au—Pd, Pd—Ag, Ni—Sn, Mo—Ni, Au—Al, Au—Sn, Au—Mo, Au—Ti, Au—Cr, Au—Mn, Au—Fe, Au—Co, Au—Zn, Au—In, Au—W, Au—Ir, Au—Si, Ag—Cu, Ag—Al, Ag—Ni, Ag—Pt, Ag—Pd, Ag—Sn, Ag—Mo, Ag—Ti, Ag—Cr, Ag—Mn, Ag—Fe, Ag—Zn, Ag—In, Ag—W, Ag—Ir and Ag—Si, or a three-component material selected from the group consisting of Au—Ag—Cu, Au—Cu—Pt, Au—Ag—Pt, Au—Ag—Pd, Au—Cu—Pd, Ag—Cu—Pt and Ag—Cu—Pd.

7. The method of claim 1, wherein the multicomponent material is a combination of two to six components.

8. The method of claim 1, wherein the prepattern is polystyrene, chitosan, polyvinyl alcohol, polymethylmethacrylate (PMMA), polyvinyl pyrrolidone, photoresist (PR), or a mixture thereof.

9. The method according to claim 1, wherein the multilayer structure has a film thickness of 10 nm to 500 nm.

10. The method of claim 1, wherein the multicomponent material is a combination of three to six components.

11. The method of claim 1, wherein the multilayer structure on the substrate prepattern and side surface of the prepattern is a sandwich structure.

* * * * *